(12) United States Patent
Choi et al.

(10) Patent No.: US 7,274,586 B2
(45) Date of Patent: Sep. 25, 2007

(54) METHOD FOR PROGRAMMING PHASE-CHANGE MEMORY ARRAY TO SET STATE AND CIRCUIT OF A PHASE-CHANGE MEMORY DEVICE

(75) Inventors: Byung-Gil Choi, Yongin-si (KR); Du-Eung Kim, Yongin-si (KR); Choong-Keun Kwak, Suwon-si (KR); Beak-Hyung Cho, Hwaseong-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

(21) Appl. No.: 11/070,196

(22) Filed: Mar. 3, 2005

(65) Prior Publication Data

US 2005/0195633 A1 Sep. 8, 2005

(30) Foreign Application Priority Data

Mar. 5, 2004 (KR) .................. 10-2004-0014954

(51) Int. Cl.
*G11C 11/00* (2006.01)
(52) U.S. Cl. .................................. 365/148
(58) Field of Classification Search ............. 365/148, 365/163
See application file for complete search history.

(56) References Cited

U.S. PATENT DOCUMENTS 6,487,113 B1* 11/2002 Park et al. .............. 365/163
6,570,784 B2* 5/2003 Lowrey .................. 365/163
6,625,054 B2* 9/2003 Lowrey et al. ........... 365/148
6,928,022 B2* 8/2005 Cho et al. ............. 365/225.7
2004/0228159 A1* 11/2004 Kostylev et al. ......... 365/148
2005/0141261 A1* 6/2005 Ahn ....................... 365/148

FOREIGN PATENT DOCUMENTS

JP 2002-203392 A 7/2002

* cited by examiner

*Primary Examiner*—Amir Zarabian
*Assistant Examiner*—Anthan T Tran
(74) *Attorney, Agent, or Firm*—Harness, Dickey & Pierce

(57) ABSTRACT

A method for programming a phase-change memory array and circuit of a phase-change memory device, each having a plurality of phase-change memory cells, may enable all the phase-change memory cells therein to be changed or set at a set resistance state, and may reduce the time needed to change the phase-change memory array to the set resistance state. In the method, a set current pulse having first through $n^{th}$ stages may be applied to the cells of the array to change the cells to the set resistance state. A minimum current level of the set current pulse applied to the phase-change memory cells in any stage may be higher than a reference current level for the cells of the array. A given current level of the set current pulse may be sequentially reduced from stage to stage.

24 Claims, 5 Drawing Sheets

METHOD FOR PROGRAMMING PHASE-CHANGE MEMORY ARRAY TO SET STATE AND CIRCUIT OF A PHASE-CHANGE MEMORY DEVICE

CROSS-REFERENCE TO RELATED APPLICATIONS

This application claims the priority of Korean Patent Application No. 2004-14954, filed on Mar. 5, 2004, in the Korean Intellectual Property Office, the disclosure of which is incorporated herein in its entirety by reference.

BACKGROUND OF THE INVENTION

1. Field of the Invention

The present invention relates, in general, to a method and circuit for programming a phase-change memory array to a set state.

2. Description of the Related Art

Phase-change random access memories (PRAMs) are non-volatile memory devices that store data using a phase-change material, such as a chalcogenide (e.g., Ge—Sb—Te (GST)), the electric resistance of which varies upon a phase transition between two states that is caused by a change in temperature. PRAMs have many of the advantages of both volatile memories such as dynamic random access memories (DRAMs) and non-volatile memories, at a generally lower power consumption.

If current flows through a phase-change material during a write operation, for example, the phase-change material may change back and forth between a crystalline state and an amorphous state. As an example, a phase-change material may be heated to its melting point by applying a relatively high current pulse to the phase-change material for a relatively short duration of time. The phase-change material may then be rapidly cooled, which changes the phase-change material to a highly resistive, amorphous state. If the phase-change material layer in the rest state is cooled by applying a relatively low current pulse, the phase-change material may be changed to a lower resistive, crystalline state.

Thus, the final state depends on the amount of current and/or duration that current flows through the phase-change material. A relatively large current flowing through the phase-change material for a relatively short time (referred to as a 'reset current' or reset current pulse') changes the phase-change material from a crystalline state to an amorphous state. The amorphous state may be referred to as a 'reset state' corresponding to data having a logic level value of "1". A current smaller than the reset current that is flowing through the phase-change material for a relatively longer duration changes the phase-change material from the amorphous state back to the crystalline state. The crystalline state may be referred to as a 'set state' corresponding to data having a logic level value of "0".

The resistance of the phase-change material in the reset state is greater than the resistance of the phase-change material in the set state. A memory cell that is initially in a set state may thus be changed to a reset state by flowing a reset current through the phase-change material to heat the phase-change material above its melting temperature, and then quickly quenching the heated phase-change material, as described above. The memory cell initially in a reset state may be changed to a set state by flowing a set current through the phase-change material to heat the phase-change material above its crystallizing temperature, maintaining the current for a given period of time, and then cooling the phase-change material.

FIG. 1 is a graph illustrating a conventional current pulse used for writing data to a phase-change material. In a conventional method of writing data, as shown in FIG. 1, a relatively high current pulse may be applied to a phase-change material for a relatively short duration to melt the phase-change material. The phase-change material is then cooled fast to change the state of the phase-change material to an amorphous state (i.e., a reset state). Alternatively, a relatively lower current pulse is applied to the phase-change material for a relatively longer duration (as shown in FIG. 1) to heat the phase-change material at a temperature that is greater than the crystallizing temperature of the phase-change material, so as to change the phase-change material to a crystalline state (i.e., a set state).

However, in a memory array having a plurality of phase-change memory cells, parasitic resistances may vary among the individual or groups of phase-change memory cells, depending on cell arrangements within the memory array. Further, signal loads may vary on lines connected to the phase-change memory cells, and reset currents may vary among the phase-change memory cells due to, for example, differences in manufacturing processes as the area of the memory array increases. If the reset currents vary between or among different memory cells, set currents also vary among the memory cells.

Consequently, the level or amount of the set current pulses used to change the memory cells to a set state may vary between memory cells of the memory array. This may be undesirable, since it is impossible to change all the memory cells in the memory array to a set state using one set current. In other words, if one set current is applied, some of the memory cells may change to a set state, but other memory cells may actually change to a reset state. Also, resistance values may vary among the memory cells that do change to the set state. This may cause errors in phase-change memory array operation.

FIG. 2 is a graph showing the relationship between current applied to the phase-change memory cells and the resistance of the phase-change memory cells. Referring to FIG. 2, three memory cells (A, B, and C) exemplifying given memory cells of the phase-change memory array will be described as an example of the relationship between the current applied to phase-change memory cells and the resistance of the phase-change memory cells. The memory cells A, B, and C each have different reset/set current curves. The memory cell A is a 'high' set current cell, the memory cell B is an 'intermediate' set current cell, and the memory cell C is a 'low' set current cell. The graph of FIG. 2 illustrates that the amounts or levels of current needed to change the memory cells A, B, and C to a set resistance state vary among memory cells A, B, and C.

If a current corresponding to a voltage (i) shown in FIG. 2 is applied to the memory cells, the memory cell A can change to a set resistance state (as it is within a set window or that enables memory cell A to be changed to a set state), but the memory cells B and C remain in a reset state (resistance values too high). Further, the memory cells B and C have different reset resistances. As a result, since the phase-change cells of the array require different currents to change to a set state, one set current cannot be used to change all the memory cells of the array into a set state.

SUMMARY OF THE INVENTION

An exemplary embodiment of the present invention is directed to a method of programming a phase-change memory array having a plurality of phase-change memory cells to a set resistance state. In the method, a set current pulse having first through $n^{th}$ stages may be applied to the cells of the array to change the cells to the set resistance state. A minimum current level of the set current pulse applied to the phase-change memory cells in any stage may be higher than a reference current level for the cells of the array. A given current level of the set current pulse may be sequentially reduced from stage to stage.

Another exemplary embodiment of the present invention is directed to a write driver circuit of a phase-change memory device that includes a plurality of phase-change memory cells which change to a reset resistance state or a set resistance state in response to an applied current pulse thereto. The write driver circuit may include a pulse generating unit configured to generate a reset pulse for changing the phase-change memory cells to the reset resistance state in response to a data transition detection pulse, a set pulse for changing the phase-change memory cells to the set resistance state in response to the data transition detection pulse, and first through $n^{th}$ control pulses. The write driver circuit may include a current pulse control unit configured to apply a set current pulse having first through $n^{th}$ stages to the phase-change memory cells in response to the generated first through $n^{th}$ control pulses, where a minimum current level of the set current pulse in any stage is higher than a reference current level, and where current levels of the set current pulse sequentially decrease from stage to stage.

Another exemplary embodiment of the present invention is directed to a method of programming a phase-change memory array having a plurality of phase-change memory cells to a set resistance state. In the method, a set current pulse having first through $n^{th}$ stages of current levels may be applied to the cells of the array to change the cells to the set resistance state.

Another exemplary embodiment of the present invention is directed to a write driver circuit of a phase-change memory device that includes a plurality of phase-change memory cells. The write driver circuit may be configured to apply a set current pulse having first through $n^{th}$ stages of current levels to the cells of the device to change the phase-change memory cells of the device to the set resistance state.

BRIEF DESCRIPTION OF THE DRAWINGS

The present invention will become more apparent by describing, in detail, exemplary embodiments thereof with reference to the attached drawings, wherein like elements are represented by like reference numerals, which are given by way of illustration only and thus do not limit the exemplary embodiments of the present invention.

DETAILED DESCRIPTION OF THE EXEMPLARY EMBODIMENTS

Figure 1:
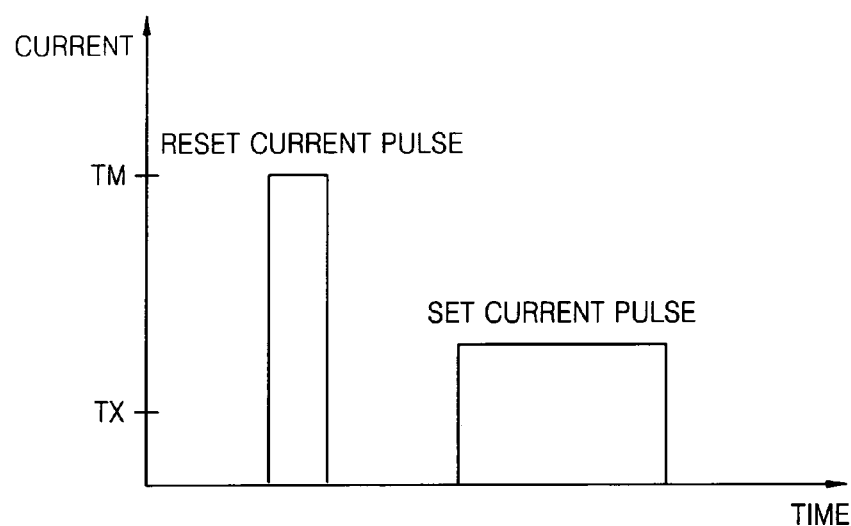
FIG. 1 is a graph illustrating a conventional current pulse used for writing data to a phase-change material.
Figure 2:
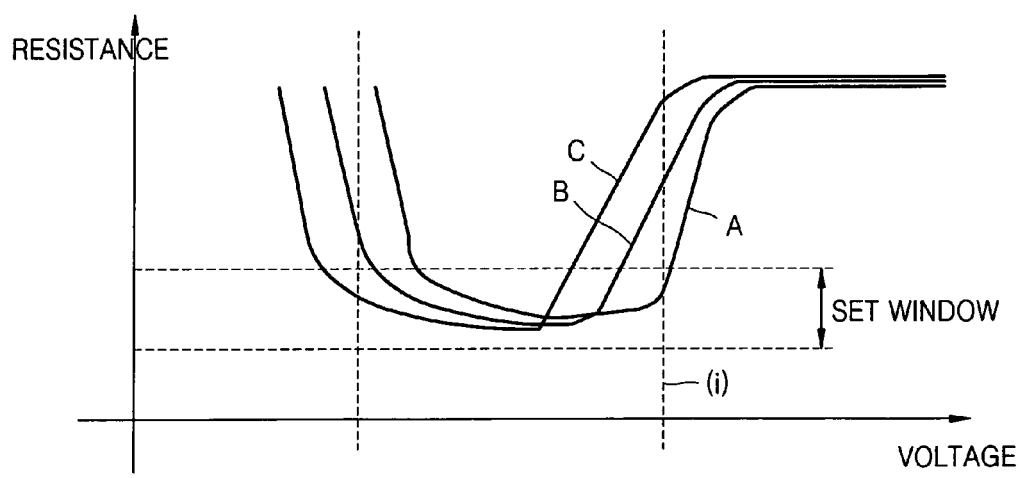
FIG. 2 is a graph showing the relationship between current applied to phase-change memory cells and the resistance of the phase-change memory cells.
Figure 3:
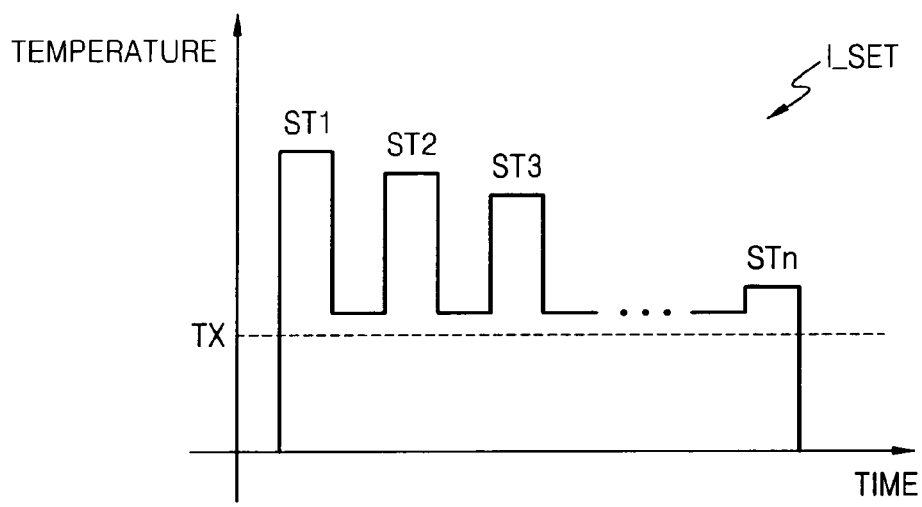
FIG. 3 is a graph illustrating a set current pulse applied to a phase-change memory array according to an exemplary embodiment of the present invention.

FIG. 3 is a graph illustrating a set current pulse applied to a phase-change memory array according to an exemplary embodiment of the present invention. In general, in order to program a phase-change memory array to a set state, a set current pulse may be applied to phase-change memory cells of the array. In an example, the set current pulse, I_SET, may include first through nth stages, ST1 through STn. In any given stage, the minimum current level may remain greater than a reference current value. The current level of the set current pulse I_SET may be reduced sequentially from stage to stage as it is applied to the phase-change memory cells of the array. The currents of the set current pulse I_SET may vary from memory cell to memory cell and/or among the memory cells of the phase-change memory array, but the current level of the set current pulse in the first stage ST1 is at the highest current that would cause a given phase-change cell in the memory array to transit to a set resistance state, i.e., to enter the set resistance state.

In other words, one given phase-change memory cell in the memory array will require a higher current than any of the other phase-change memory cells in the array in order to transit to (change to) a set state. The level of the set current pulse in the first stage ST1 will thus be at that 'highest' current. However, the level of the set current pulse in the first stage ST1 does not exceed a current level required to heat any one of the phase-change cells in the memory array to their melting temperature (i.e., the current level does not approach a current that will generate a temperature that reaches or exceeds the melting point of any one memory cell in the array).

As shown in FIG. 3, the current levels of the set current pulse I_SET may be sequentially reduced from stage to stage. The current level in the first stage ST1 is the highest, with the current level of the pulse in the $n^{th}$ stage STn being the lowest. However, the current in the $n^{th}$ stage STn, which is the minimum current level applied to a given memory cell in the array to change that cell to a set state, remains higher than the reference current level, which is a current sufficient to maintain the phase-change cells above a crystallizing temperature TX at which the phase-change cells begin to crystallize.

The exemplary methodology of programming the phase-change memory array to the set state may be based on a principle that if all the phase-change memory cells of the memory array fall into a low resistance state in the first stage ST1 of the set current pulse I_SET, the resistances of the phase-change memory cells do not therefore increase with subsequent set current pulses in later stages, since these subsequent set current pulses are at currents lower than the current level of the set current pulse I_SET applied in the first stage ST1.

Accordingly, if the current levels for the set current pulse I_SET in all n stages (which are all greater than the reference current level and which are reduced sequentially with each stage), are applied to the phase-change memory cells, all of the phase-change memory cells in the memory array may have the same set resistance. Further, since each stage at which the set current pulse I_SET is applied to given phase-change memory cells occurs only when the current level is higher than the reference current level, the time or duration needed to program all the phase-change memory cells in the memory array to a set state may be substantially reduced.

Thus, the set current pulse I_SET may have a plurality of stages. The number of stages in which all the phase-change cells can change to a set resistance state may be determined as a function of the size of the memory array, and/or the current level of the current pulse applied in the first stage ST1.

Figure 4:
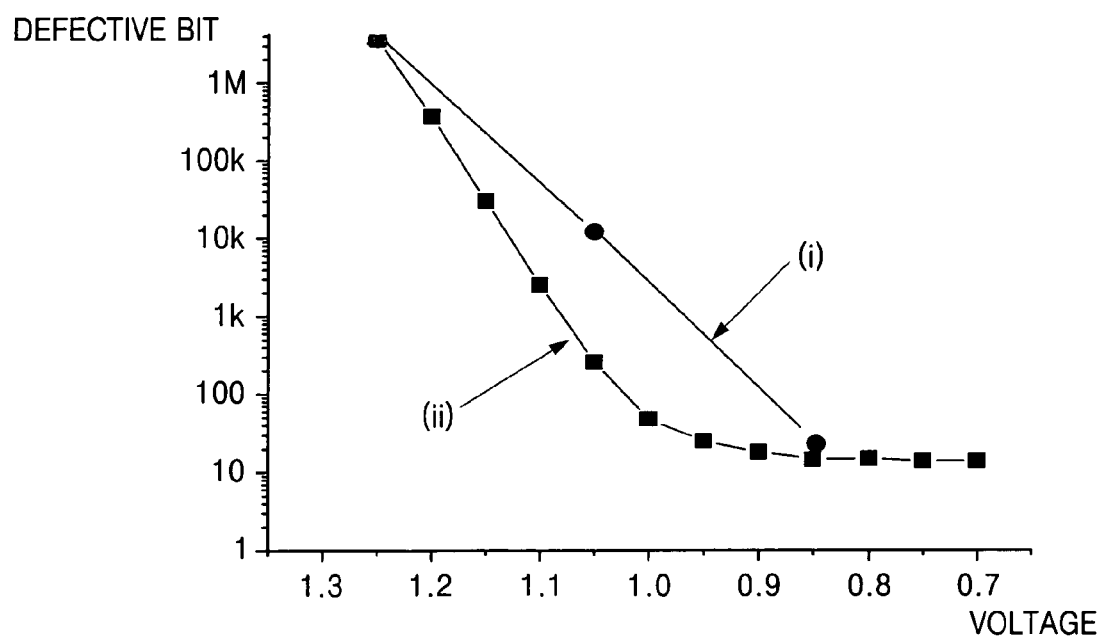
FIG. 4 is a graph for explaining defective cells when the set current pulse shown in FIG. 3 is applied.

FIG. 4 is a graph for explaining defective cells when the set current pulse shown in FIG. 3 is applied. The y-axis represent the number of defective bits; the x-axis represents a voltage level for the memory array.

Referring to FIG. 4, the curve denoted as (i) illustrates the number of defective cells present at given voltage levels in the array among the phase-change memory cells when a single set current pulse is applied. The curve denoted as (ii) illustrates the number of defective cells present among the phase-change memory cells at given voltage levels when the set current pulse I_SET having the plurality of stages ST1, ST2, ... STn as shown in FIG. 3 is applied. It can be seen that when the set current pulse I_SET according to the exemplary embodiments is applied, there are fewer defective cells at the same given voltage level.

Figure 5:
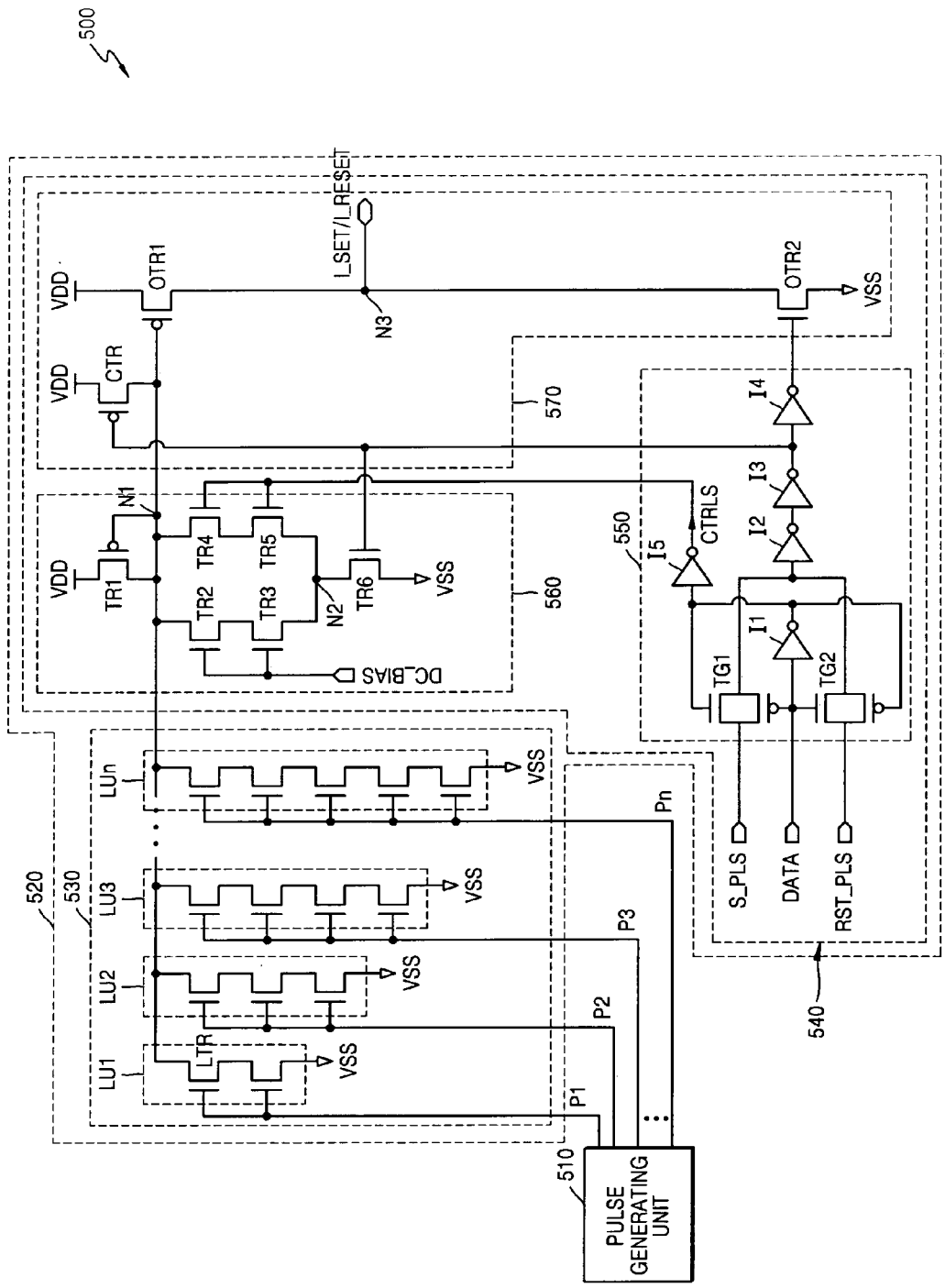
FIG. 5 is a circuit diagram of a write driver circuit according to an exemplary embodiment of the present invention.
Figure 7:
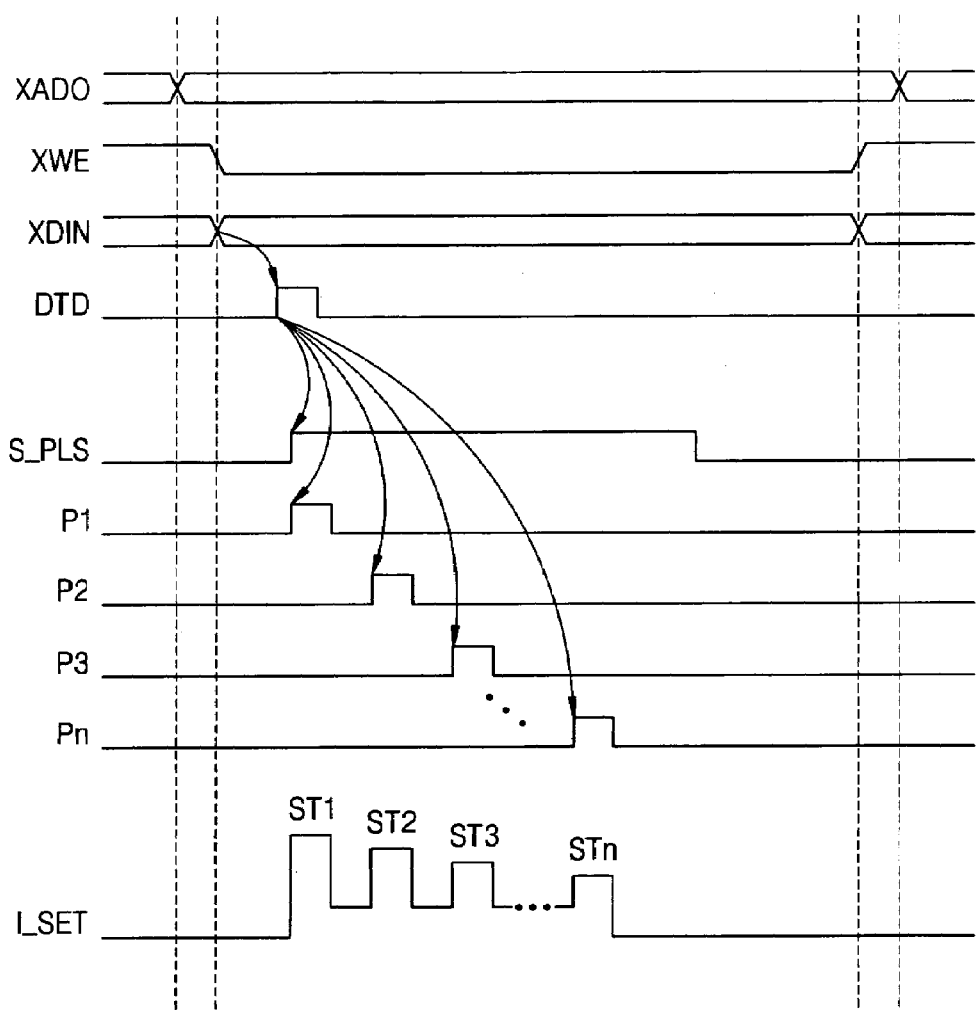
FIG. 7 is a timing diagram explaining the operation of the write driver circuit of FIG. 5.

FIG. 5 is a circuit diagram of a write driver circuit according to an exemplary embodiment of the present invention. Referring to FIG. 5, a write driver circuit 500 may include a pulse generating unit 510 and a current pulse control unit 520. The current pulse control unit 520 may further include a selective output unit 540 and a current control unit 530, which will be described in further detail below. Occasional reference should be made to the timing diagram of FIG. 7 for the following discussion. FIG. 7 is a timing diagram to assist in explaining the operation of the write driver circuit 500 of FIG. 5.

The pulse generating unit 510 may generate a reset pulse RST_PLS which changes phase-change memory cells to a reset resistance state in response to a data transition detection pulse DTD. The pulse generating unit 510 may also generate a set pulse S_PLS, which changes the phase-change memory cells to a set resistance state in response to the data transition detection pulse DTD, and may further generate first through $n^{th}$ control pulses P1 through Pn, which may be activated sequentially.

The current pulse generating unit 520 may apply the set current pulse I_SET having first through $n^{th}$ stages to the phase-change memory cells of the memory array in response to the first through nth control pulses P1 through Pn. As previously discussed, the minimum current level of a given set current pulse applied to the phase-change memory cells at any one stage is higher than the reference current level, and the current levels of the set current pulse applied from stage to stage may be sequentially reduced, as shown in FIG. 3.

Figure 6:
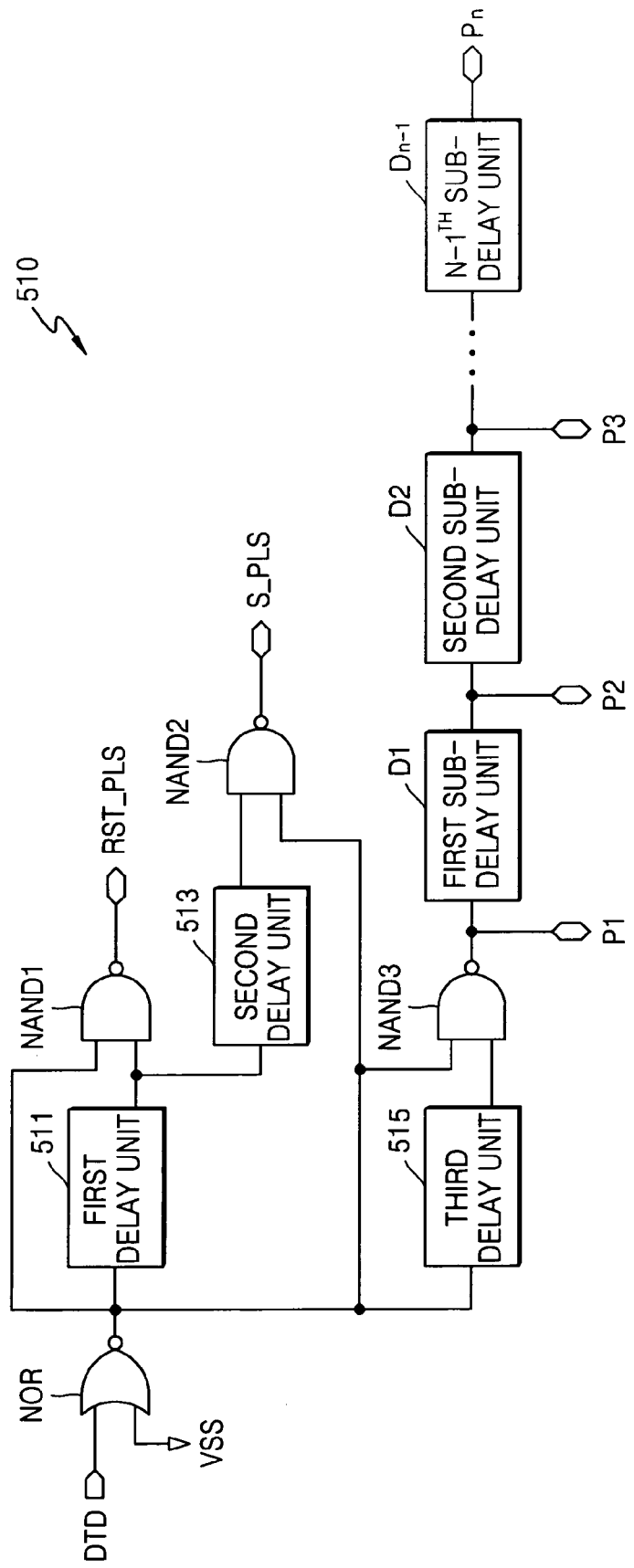
FIG. 6 is a circuit diagram of a pulse generating unit in the write driver circuit of FIG. 5.

FIG. 6 is a circuit diagram of the pulse generating unit 510 in the write driver circuit 500 of FIG. 5. The configuration and operation of the pulse generating unit 510 may be explained in further detail with reference to FIG. 6.

The pulse generating unit 510 may include a NOR gate NOR. The NOR gate NOR may implement a NOR function on a data transition detection pulse DTD and a ground voltage VSS. The data transition detection pulse DTD may be activated if the logic value of input data XDIN (see FIG. 7) is changed.

The pulse generating unit 510 may include a first delay unit 511 and a first NAND gate NAND1. The first delay unit 511 delays an output of the NOR gate NOR. The first NAND gate NAND1 implements a NAND function on the output of the NOR gate NOR and on an output of the first delay unit 511 to output the reset pulse RST_PLS.

The pulse generating unit 510 may include a second delay unit 513 and a second NAND gate NAND2. The second delay unit 513 delays the output of the first delay unit 511. The second NAND gate NAND2 implements a NAND function on an output of the second delay unit 513 and on the output of the NOR gate NOR to output the set pulse S_PLS.

Referring now to FIG. 7, if an address signal XADO and a write activate signal XWE are activated and the input data XDIN is input, the data transition detection pulse DTD is activated. The data transition detection pulse DTD is a pulse signal having a relatively short activation period, as seen in FIG. 7.

If the data transition detection pulse DTD is input, the set pulse S_PLS is generated due to the NOR gate NOR, the first and second delay units 511 and 513, and the second NAND gate NAND2. Although the data transition detection pulse DTD has a short activation period, the set pulse S_PLS has a relatively long activation period, as can be seen in FIG. 7. This longer activation period is due to delays in the first delay unit 511 and the second delay unit 513.

The pulse generating unit 510 may include a third delay unit 515, a third NAN gate NAND3 and first through $n-1^{th}$ sub-delay units D1 through Dn-1. If the data transition detection pulse DTD is generated at a high level, the first control pulse P1 may be generated due to the NOR gate NOR, the third delay unit 515, and the third NAND gate NAND3, as shown in FIG. 6.

The first through $n-1^{th}$ sub-delay units D1 to Dn-1 may be connected in series to the output of the third NAND gate NAND3, and are provided to delay the first control pulse P1 so as to output corresponding second through $n^{th}$ control pulses P2 to Pn, as shown in FIG. 6. The first through $n^{th}$ control pulses P1-Pn may be generated sequentially during the activation period of the set pulse S_PLS, and are thus applied to the current pulse control unit 520 so as to generate the set current pulse I_SET shown in FIG. 3.

Referring again to FIG. 5, the current pulse control unit 520 includes a selective output unit 540 and a current control unit 530. The selective output unit 540 may output the set current pulse I_SET or a reset current pulse I_RESET in response to data DATA and the set pulse S_PLS or the reset pulse RST_PLS. The current control unit 530 controls the current level of the set current pulse I_SET output from the selective output unit 540 in response to the first through $n^{th}$ control pulses P1 through Pn.

The selective output unit 540 may further include a select unit 550, a drive unit 560 and an output unit 570. The select unit 550 generates the set pulse S_PLS and a control signal CTRLS if the data DATA is set data, and generates the reset pulse RST_PLS and the control signal CTRLS if the data DATA is reset data.

In an example, it may be assumed that the input data DATA is set data. The set data has a low level, that is, a logic value "0". Then, a first transmission gate TG1 is turned on, the set pulse S_PLS received from the pulse generating unit 510 (see FIG. 6) is output, and a second transmission gate TG2 is turned off. Inverters I1 and I5 generate the set data as the control signal CTRLS. Accordingly, the control signal CTRLS has a low level. Inverters I2 and I3 output the set pulse S_PLS.

Conversely, if it is assumed that the input data DATA is reset data, which has a high level, i.e., a logic value "1", the first transmission gate TG1 is turned off, the reset pulse RST_PLS received from the pulse generating unit 510 is output, and the second transmission gate TG2 is turned on. In this example, inverters I1 and I5 generate the reset data as the control signal CTRLS at a high level, and inverters I2 and I3 output the reset pulse RST_PLS.

The drive unit 560 operates in response to the set pulse S_PLS or the reset pulse RST_PLS, and controls the voltage of a first node N1 in response to the control signal CTRLS. Referring to FIG. 5, the drive unit 560 may include first through sixth transistors TR1-TR6. The first transistor TR1 has a first terminal connected to a power voltage VDD, and a gate and a second terminal connected to the first node N1.

The second and third transistors TR2 and TR3 are connected in series between the first node N1 and a second node N2, and have gates to which a bias voltage DC_BIAS is applied. The bias voltage DC_BIAS turns on the second and third transistors TR2 and TR3.

The fourth and fifth transistors TR4 and TR5 are connected in series between the first node N1 and the second node N2. The control signal CTRLS is applied to the gates of the fourth and fifth transistors TR4 and TR5.

The sixth transistor TR6 has a first terminal connected to the second node N2, a gate to which the set pulse S_PLS or the reset pulse RST_PLS is applied, and a second terminal connected to a ground voltage VSS. If the data DATA is set data, the fourth and fifth transistors TR4 and TR5 are turned off in response to the low level control signal CTRLS. If the data DATA is reset data, the fourth and fifth transistors TR4 and TR5 are turned on in response to the high level control signal CTRLS.

Thus, if the set data and the set pulse S_PLS are applied to the select unit 550, the control signal CTRLS output from the select unit 550 to the drive unit 560 has a low level, which turns off the fourth and fifth transistors TR4 and TR5 in the drive unit 560. The second through fifth transistors TR2 through TR5 control the voltage of the first node N1.

Since the second and third transistors TR2 and TR3 are always turned on due to the bias voltage DC_BIAS, the voltage of the first node N1 is determined by the fourth and fifth transistors TR4 and TR5. Since the fourth and fifth transistors TR4 and TR5 are turned off if the set pulse S_PLS is input and the control signal CTRLS is generated at the low level, the voltage of the first node N1 is higher than in the case when the fourth and fifth transistors TR4 and TR5 are turned on (i.e., when the data DATA is reset data and the control signal CTRLS output from select unit 550 is at a high level).

Referring to FIG. 5, the output unit 570 operates in response to the set pulse S_PLS or the reset pulse RST_PLS, and controls the current level of the set current pulse I_SET or the reset current pulse I_RESET in response to the voltage at the first node N1.

The output unit 570 may include a control transistor CTR, and first and second output transistors OTR1 and OTR2. The control transistor CTR has a first terminal connected to the power voltage VDD, a gate connected to the set pulse S_PLS or the reset pulse RST_PLS, and a second terminal connected to the first node N1. The first output transistor OTR1 has a first terminal connected to the power voltage VDD, a gate connected to the first node N1, and a second terminal connected to a third node N3. The second output transistor OTR2 has a first terminal connected to the third node N3, a gate connected to an inversion of the set pulse S_PLS or the reset pulse RST_PLS, and a second terminal connected to the ground voltage VSS.

The control transistor CTR is initially turned on to keep the first output transistor OTR1 turned off. If the set pulse S_PLS input to the select unit 550 is applied (via inverter I3) to the control transistor CTR, the control transistor CTR is turned off, and the gate of the first output transistor OTR1 is controlled by the voltage of the first node N1.

If the set pulse S_PLS is activated to a high level, an inverter I4 inverts the set pulse S_PLS and applies the inverted signal to the second output transistor OTR2. Then, the second output transistor OTR2 is turned off. Accordingly, while the set pulse S_PLS is activated, the first output transistor OTR1 outputs the set current pulse I_SET in response to the voltage of the first node N1.

Operation of the current control unit 530 are now described in further detail with reference to FIGS. 5 and 7. The current and waveform of the output set current pulse I_SET may be controlled by the current control unit 530.

The current control unit 530 may include first through $n^{th}$ load units LU1-LUn, which may be connected in parallel between the first node N1 and the ground voltage VSS. The first through $n^{th}$ load units LU1-LUn may be activated in response to the corresponding first through $n^{th}$ control pulses P1 through PN, and may sequentially increase the voltage at the first node N1.

The first through $n^{th}$ load units LU1-LUn include a plurality of load transistors LTR. The load transistors LTR increase sequentially in number in the first through $n^{th}$ load units LU1-LUn.

Accordingly, when the load transistors LTR of the first through $n^{th}$ load units LU1-LUn are turned on, the loads of the first through $n^{th}$ load units LU1-LUn are increased sequentially.

If the first through $n^{th}$ load units LU1-LUn are turned on sequentially, the voltage at the first node N1 thus increases sequentially. Accordingly, the voltage at the gate of the first output transistor OTR1 increases sequentially, and the current of the set current pulse I_SET output from the first output transistor OTR1 decreases sequentially.

If the first through $n^{th}$ control pulses P1-Pn are generated from the pulse generating unit 510 as shown in the timing diagram of FIG. 7 and the first through $n^{th}$ load units LU1-LUn are activated in response to the corresponding first through $n^{th}$ control pulses P1-Pn, the set current pulse I_SET output from the output unit 570 has the same waveforms as shown in FIG. 3.

The minimum current level of the set current pulse I_SET can be controlled so as to be higher than the given reference current level by adjusting the number of load transistors LTR of the $n^{th}$ load unit LUn. Here, the reference current level is a current level that is sufficient to maintain the phase-change cells to which the set current pulse I_SET is applied above the crystallizing temperature TX at which the phase-change cells begin to crystallize.

The maximum current level of the set current pulse I_SET can be controlled so as to be equal but not exceed the highest current required to change the phase-change cells to a set resistance state. This may be accomplished by adjusting the number of load transistors LTR of the first load unit LU1.

As described above, the method and circuit for programming a phase-change memory array to a set state can maintain all the phase-change memory cells of the phase-change memory array at a set resistance state, and may reduce the time needed to change the phase-change memory array to the set resistance state.

While the present invention has been particularly shown and described with reference to exemplary embodiments thereof, it will be understood by those of ordinary skill in the art that various changes in form and details may be made therein without departing from the spirit and scope of the exemplary embodiments of the present invention as defined by the following claims.

What is claimed is:

1. A method of programming a phase-change memory array having a plurality of phase-change memory cells to a set resistance state, comprising:

applying a set current pulse having first through $n^{th}$ stages, each stage having a leading and trailing edge, to the phase-change memory cells of the array to change the cells to the set resistance state, where a minimum current level of the set current pulse applied to the phase-change memory cells in any stage is higher than a reference current level, the reference current level being sufficient to maintain the phase-change memory cells above a crystallizing temperature at which the phase-change memory cells begin to crystallize, and where a given current level of the set current pulse is sequentially reduced from stage to stage.

2. The method of claim 1, wherein the current level of the set current pulse in the first stage is a current level for causing a given phase-change memory cell among the plurality of phase-change memory cells that requires the highest current in order to transit to the set resistance state, to enter the set resistance state.

3. The method of claim 1, wherein the current level of the set current pulse in the first stage does not exceed a current level required to heat the phase-change cells to the melting point of the phase-change memory cells.

4. The method of claim 1, wherein the phase-change memory cells are configured to be changed between a reset resistance state and a set resistance state in response to one of an applied reset current pulse and the set current pulse.

5. A method of programming a phase-change memory array having a plurality of phase-change memory cells to a set resistance state, comprising:

applying a first current pulse having a leading and trailing edge at a given current level to the phase-change memory cells to change the phase-change memory cells to the set resistance state; and sequentially applying second through $n^{th}$ current pulses, each pulse having a leading and trailing edge and having current levels lower than the given current level of the first current pulse to the phase-change memory cells, wherein the current of the second through $n^{th}$ current pulses sequentially decreases from
state to stage, and a minimum current level of the set current pulse applied to the phase-change memory cells in any stage is higher than a reference current level, the reference current level being sufficient to maintain the phase-change memory cells above a crystallizing temperature at which the phase-change memory cells begin to crytallizing.

6. The method of claim 5, wherein the current level of the first current pulse is a current level for causing a given phase-change memory cell among the plurality of phase-change memory cells that requires the highest current in order to transit to a set resistance state, to enter the set resistance state.

7. The method of claim 5, wherein the current level of the first current pulse does not exceed a current level required to heat the phase-change memory cells to the melting point of the phase-change memory cells.

8. The method of claim 5, wherein the phase-change memory cells are configured to be changed between a reset resistance state and a set resistance state in response to one of an applied reset current pulse and the set current pulse.

9. A write driver circuit configured for a phase-change memory device that includes a plurality of phase-change memory cells which change to a reset resistance state or a set resistance state in response to an applied current pulse thereto, the write driver circuit comprising:

a pulse generating unit configured to generate a reset pulse for changing the phase-change memory cells to the reset resistance state in response to a data transition detection pulse, a set pulse for changing the phase-change memory cells to the set resistance state in response to the data transition detection pulse, and first through $n^{th}$ control pulses; and a current pulse control unit configured to apply a set current pulse having first through $n^{th}$ stages, each stage having a leading and trailing edge, to the phase-change memory cells in response to the generated first through $n^{th}$ control pulses, where a minimum current level of the set current pulse in any stage is higher than a reference current level that is sufficient to maintain the phase-change memory cells above a crystallizing temperature at which the phase-change memory cells begin to crystallize, and where current levels of the set current pulse sequentially decrease from stage to stage.

10. The circuit of claim 9, wherein the first through $n^{th}$ control pulses are sequentially activated while the set pulse is activated, and then deactivated.

11. The circuit of claim 9, wherein the data transition detection pulse is activated if a logic value of input data that is input to the pulse generating unit changes.

12. The circuit of claim 9, wherein the current level of the set current pulse in the first stage is a current level for causing a given phase-change memory cell, among the plurality of phase-change cells that requires the highest current to transit to a set resistance state, to enter the set resistance state.

13. The circuit of claim 9, wherein the current level of the set current pulse in the first stage does not exceed a current level required to heat the phase-change cells to the melting point of the phase-change memory cells.

14. The circuit of claim 9, wherein the pulse generating unit includes:

a NOR gate configured to implement a NOR function on the data transition detection pulse and a ground voltage;

a first delay unit configured to delay the output of the NOR gate;

a first NAND gate configured to implement a NAND function on the output of the NOR gate and the output of the first delay unit to output the reset pulse;

a second delay unit configured to delay the output of the first delay unit;

a second NAND gate configured to implement a NAND function on the output of the second delay unit and the output of the NOR gate to output the set pulse;

a third delay unit configured to delay the output of the NOR gate;

a third NAND gate configured to implement a NAND function on the output of the NOR gate and the output of the third delay unit to output the first control pulse; and first through n-1$^{th}$ sub-delay units connected in series to the output of the third NAND gate and delay the first control pulse, and configured to output the corresponding second through n$^{th}$ control pulses.

15. The circuit of claim 9, wherein the current pulse control unit includes:

a selective output unit configured to output at least one of a set current pulse and a reset current pulse in response to input data and one of the set pulse or the reset pulse; and a current control unit configured to control the current level of at least the set current pulse output from the selective output unit, in response to the first through n$^{th}$ control pulses.

16. The circuit of claim 15, wherein the current control unit comprises first through n$^{th}$ load units connected in parallel between a first node and a ground voltage, and the first through n$^{th}$ load units are activated in response to the corresponding first through n$^{th}$ control pulses to sequentially increase the voltage at the first node.

17. The circuit of claim 16, wherein if the first through n$^{th}$ load units are activated, the loads of the first through n$^{th}$ load units are increased sequentially.

18. The circuit of claim 15, wherein the selective output unit includes:

a select unit configured to generate the set pulse and a control signal if the input data is set data, else to generate the reset pulse and control signal if the input data is reset data;

a drive unit configured to operate in response to the set pulse or the reset pulse, and to control a voltage at a first node in response to the control signal; and an output unit configured to operate in response to the set pulse or the reset pulse, and to control the current level of the set current pulse or the reset current pulse in response to the voltage at the first node.

19. The circuit of claim 18, wherein the drive unit includes:

a first transistor having a first terminal connected to a power voltage, and a gate and a second terminal connected to the first node;

second and third transistors connected in series between the first node and a second node, wherein a bias voltage is applied to gates of the second and third transistors;

fourth and fifth transistors connected in series between the first node and the second node, wherein the control is applied to gates of the fourth and fifth transistors; and a sixth transistor having a first terminal connected to the second node, a gate to which the set pulse or the reset pulse is applied, and a second terminal connected to a ground voltage, wherein if the input data is set data, the fourth and fifth transistors are turned off in response to the control signal, else if the input data is reset data, the fourth and fifth transistors are turned on in response to the control signal.

20. The circuit of claim 19, wherein the output unit includes:

a control transistor having a first terminal connected to the power voltage, a gate connected to the set pulse or the reset pulse and a second terminal connected to the first node;

a first output transistor having a first terminal connected to the power voltage, a gate connected to the first node and a second terminal connected to a third node; and a second output transistor having a first terminal connected to the third node, a gate connected to an inversion of the set pulse or the reset pulse, and a second terminal connected to the ground voltage.

21. A write driver circuit of a phase-change memory device having a plurality of phase-change memory cells configured to change to a reset resistance state or a set resistance state in response to an applied current pulse, the write driver circuit configured to apply a set current pulse having first through n$^{th}$ stages, each stage having a leading and trailing edge, of current levels to the cells of the array change the phase-change memory cells of the device to the set resistance state, wherein a minimum current level of the set current pulse applied to the phase-change memory cells in any stage is higher than a reference current level that is sufficient to maintain the phase-change memory cells above a crystallizing temperature at which the phase-change cells begin to crystallize.

22. The circuit of claim 21, wherein a given current level of the set current pulse is sequentially reduced from the first stage to the n$^{th}$ stage.

23. The circuit of claim 21, wherein the current level of the set current pulse in the first stage is a current level for causing a given phase-change memory cell among the plurality phase-change memory cells that requires the highest current in order to transit to the set resistance state, to enter the set resistance state.

24. The circuit of claim 21, wherein the current level of the set current pulse in the first stage does not exceed a current level required to heat the phase-change cells to the melting point of the phase-change cells.

* * * * *